United States Patent [19]
Rajeevakumar

[11] Patent Number: 5,658,816
[45] Date of Patent: Aug. 19, 1997

[54] METHOD OF MAKING DRAM CELL WITH TRENCH UNDER DEVICE FOR 256 MB DRAM AND BEYOND

[75] Inventor: Thekkemadathil Velayudhan Rajeevakumar, Scarsdale, N.Y.

[73] Assignee: International Business Machines Corporation, Armonk, N.Y.

[21] Appl. No.: 395,019

[22] Filed: Feb. 27, 1995

[51] Int. Cl.$^6$ .................. H01L 21/265; H01L 21/8242
[52] U.S. Cl. ............................... 438/386; 438/702
[58] Field of Search ................. 437/52, 60, 919, 437/67; 257/301–303

[56] References Cited

U.S. PATENT DOCUMENTS

| | | | |
|---|---|---|---|
| 4,397,075 | 8/1983 | Fatula, Jr. et al. | |
| 4,853,348 | 8/1989 | Tsubouchi et al. | 437/203 |
| 4,952,524 | 8/1990 | Lee et al. | 437/67 |
| 5,112,771 | 5/1992 | Ishii et al. | 437/67 |
| 5,176,789 | 1/1993 | Yamazaki et al. | 156/643 |
| 5,256,592 | 10/1993 | Matsushita | 437/67 |
| 5,316,979 | 5/1994 | MacDonald et al. | 437/203 |
| 5,336,912 | 8/1994 | Ohtsuki | 257/304 |
| 5,360,758 | 11/1994 | Bronner et al. | 437/52 |
| 5,449,630 | 9/1995 | Lur et al. | 437/47 |
| 5,466,625 | 11/1995 | Hsieh et al. | 437/52 |

FOREIGN PATENT DOCUMENTS

| | | | |
|---|---|---|---|
| 60-176265 | 9/1985 | Japan. | |
| 60-245161 | 12/1985 | Japan. | |
| 62-40759 | 2/1987 | Japan | H01L 27/10 |
| 63-299371 | 12/1988 | Japan | H01L 27/04 |
| 1-65862 | 3/1989 | Japan | H01L 27/04 |
| 4-287366 | 10/1992 | Japan | H01L 27/108 |

OTHER PUBLICATIONS

N.C.C. Lu et al IEDM 1988 IEEE pp. 588–591, month unknown "A Buried Trench DRAM Cell Using A Self--Aligned Epitaxy Over Trench Technology".

L. Nesbit et al IEDM 1993 IEEE pp. 627–630 "A 0.6 µm$^2$ 256 Mb Trench DRAM Cell with Self–Aligned Buried Strap (Best)", month unknown.

Primary Examiner—John Niebling
Assistant Examiner—Richard A. Booth

[57] ABSTRACT

A trench structure for a high density trench DRAM cell is proposed. The proposed trench structure, which resides in part under the access device of the cell, does not require the use of expensive selective epi growth techniques. For the proposed cell, sub-minimum lithographic trench opening can be used (1) to improve the cell area, (2) to increase the device length, and (3) to improve the margin of diffusion strap. For the proposed cell structure, trench capacitance can be significantly increased without etching deeper trenches, or using thinner capacitor dielectric, by expanding the trench laterally under the device.

7 Claims, 6 Drawing Sheets

METHOD OF MAKING DRAM CELL WITH TRENCH UNDER DEVICE FOR 256 MB DRAM AND BEYOND

FIELD OF THE INVENTION

The invention relates to DRAM cells, and in particular to a trench for use with such cells.

BACKGROUND OF THE INVENTION

As the DRAM cell is scaled towards the 256 Mb DRAM and beyond, innovative cell concepts are needed to push the cell area to practical limits. One such concept is to place the trench storage capacitor partially under the cell's access device. Although cell structures using such concepts as the buried trench cell have been proposed in the past, these structures rely on expensive selective epi growth techniques to reduce the trench opening. Selective epi growth, however, typically has a very high defect density and therefore is generally considered to be unsuitable for DRAM applications.

Thus, a need has arisen for a DRAM cell structure that can take advantage of the area minimization benefits of prior art trench-under-access device techniques, while avoiding the drawbacks associated with selective epi growth.

SUMMARY OF THE INVENTION

It is an object of the present invention to provide a DRAM cell having a smaller cell area than typical cells, but without the adverse effects of selective epi growth.

It is a further object to provide a method for fabricating such a cell.

It is a further object of the invention to provide a method for fabricating a trench capacitor for use in a reduced-area DRAM cell, the method using RIE and oxidation techniques to fabricate a storage trench at least partially under the cell's the access device.

The foregoing objectives are achieved by the present invention, which is a method for forming a trench capacitor, comprising:

providing a substrate;

forming a trench of a first depth in the substrate, the trench having an opening of a first cross sectional area at the surface of the substrate;

forming a collar on the wall of the trench;

increasing the depth of the trench to a second depth in the substrate;

expanding that portion of the trench below the collar to a cross-sectional area larger than the first cross-sectional area;

forming a dielectric layer on the wall of the trench in the expanded portion of the trench; and filling the trench with a polysilicon material.

FIGURES

DETAILED DESCRIPTION

Figure 1:
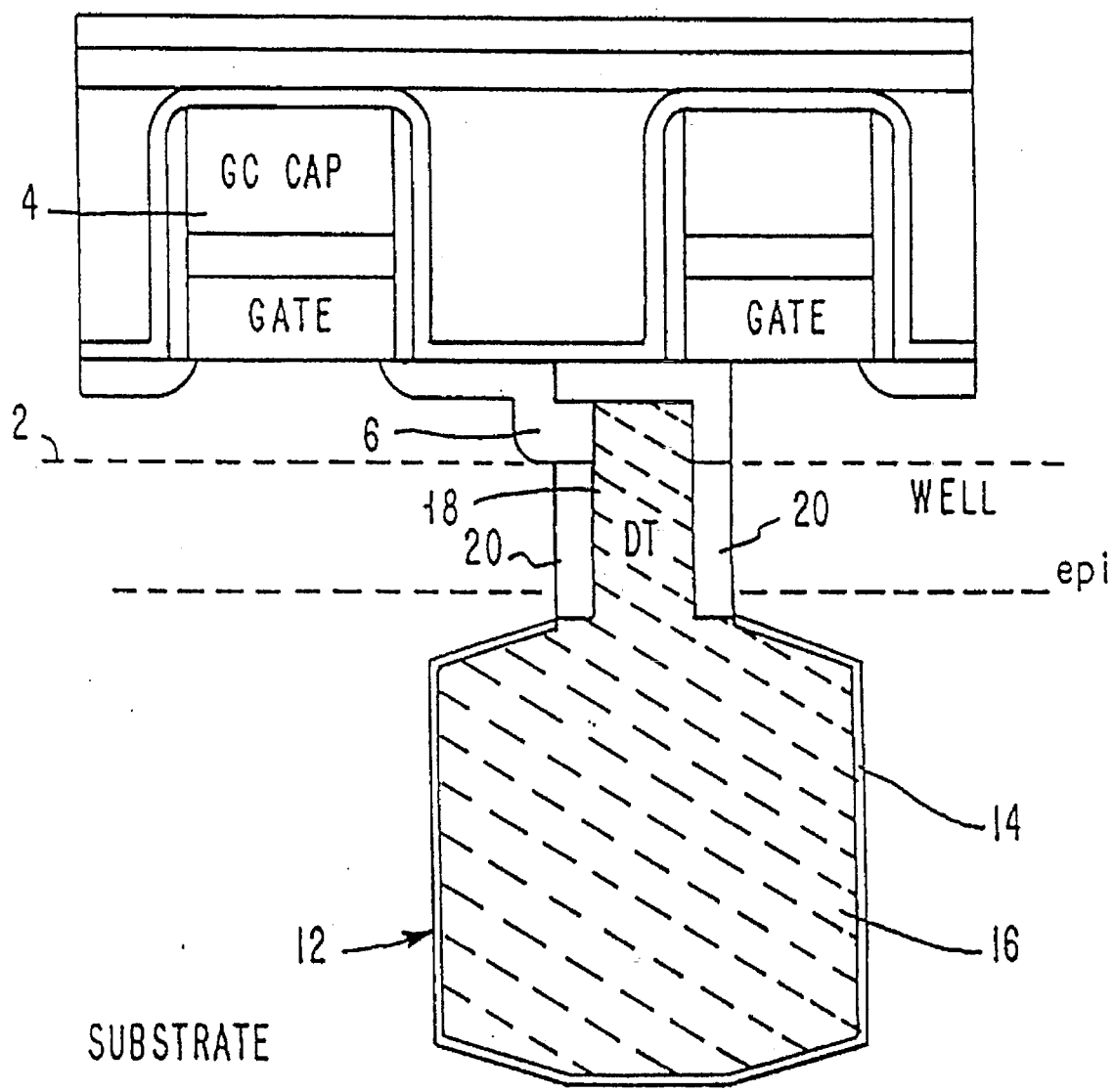
FIG. 1 is a schematic cross-sectional view of a trench constructed in accordance with the present invention.

The basic cell structure of a DRAM cell employing a trench capacitor in accordance with the invention is shown in FIG. 1. The details of the components above the line 2 are beyond the scope of this invention. An example of a DRAM structure suitable for use with the trench of the present invention can be found in L. Nesbit, et al., "A 0.6 µm² 256 Mb Trench DRAM Cell With Self-Aligned BuriEd STrap (BEST)", IEDM 93-627, pp. 26.2.1–26.2.4, 1993, ("Nesbit") which is incorporated herein by reference. Any other suitable DRAM cell can also take advantage of the benefits of the invention.

Referring to FIG. 1, a device constructed in accordance with the invention includes a storage trench 12, which is lined with a dielectric material 14, and filled with polysilicon 16. As can be seen, the storage trench extends at least partially under the access device 4 of the DRAM cell.

In a preferred embodiment of the invention shown in FIG. 1, the trench includes a neck 18 having a cross-sectional area substantially less than the cross-sectional area of the widest portion of the trench 12. Thus, in a preferred embodiment of the invention, the cell will have a "bottle" shape as shown in FIG. 1. The neck 18 is lined with a nitride collar 20. The uppermost portion of the neck terminates at the diffusion strap 6 of the DRAM cell. It will be understood that the cell of the present invention can be used with equal effect in a DRAM employing a surface strap to connect the storage node with the access device.

The trench surface opening formed by the upper portion of neck 18 can be of minimum lithography dimensions, such as shown in the preferred embodiment of FIG. 1, or, in another preferred embodiment of the invention (not shown), of sub-minimum lithography dimensions. The latter can be achieved using spacer techniques, as is well known to those skilled in the art. More specifically, oxide spacers can be employed to reduce the cross-sectional area of a photolithographic square prior to trench etching. The benefits of using a sub-minimum lithographic trench opening are: (1) decreased cell area; (2) increased device length (reducing the size of the trench opening allows room for a larger access device for a cell of a given size, which reduce the likelihood of effects such as punch-through and shorts); and (3) improved tolerance margins for a diffusion strap (that is, the size-tolerance margins for producing a sub-surface diffusion strap are greater as the distance between the access device and the trench increases, which makes the step of forming the diffusion strap simpler). A DRAM constructed using the trench capacitor of the present invention will require only six lithographic squares, instead of the standard eight squares.

The lateral extension of trench 12 under device 2 is adjusted as per the capacitance requirements of the cell, with the capacitance of the cell being proportional to the surface area of the trench.

A preferred method for fabricating the trench structure of the invention is now described with reference to FIGS. 2–6.

Figure 2:
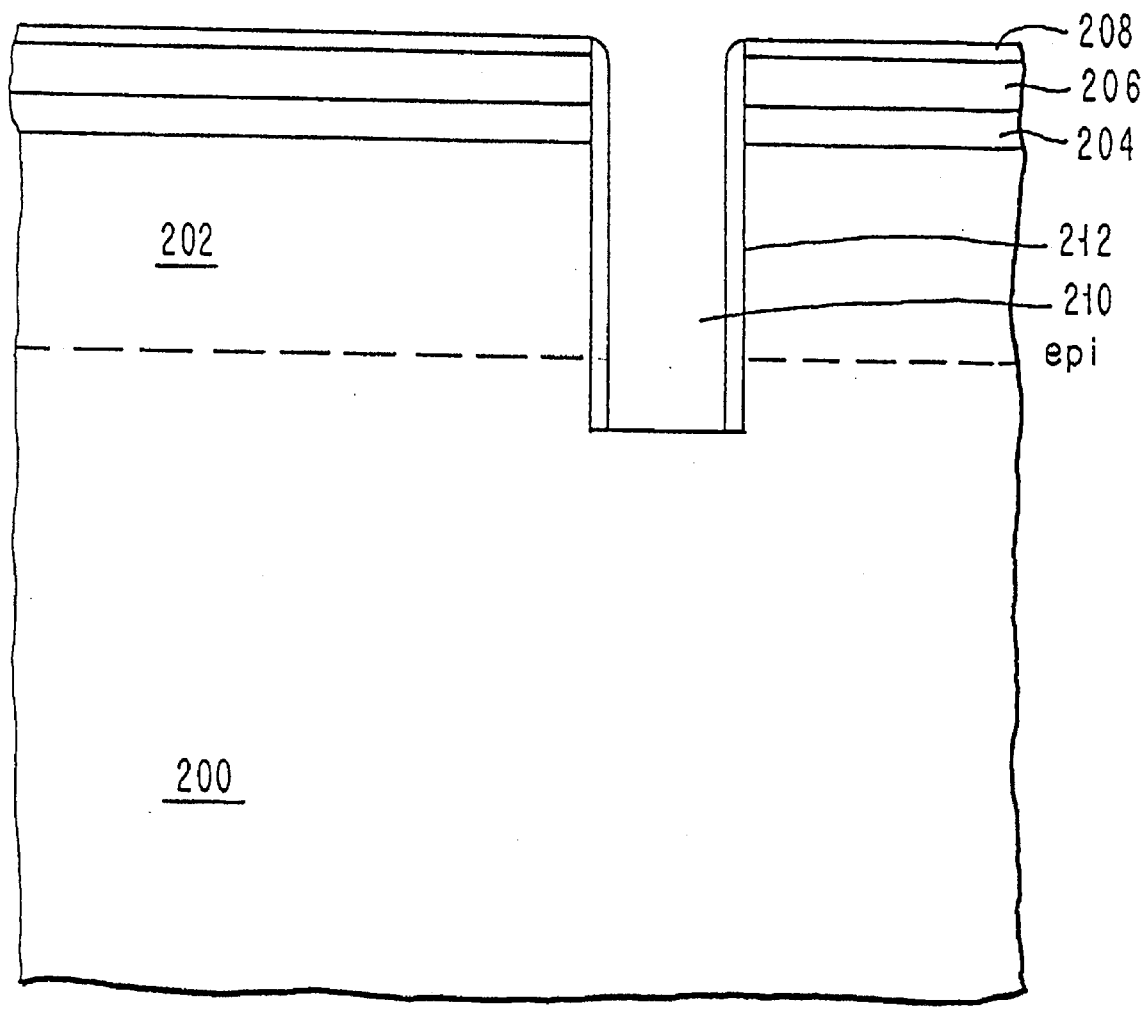
FIGS. 2–6 show cross-sectional schematic views of the cell of FIG. 1 at various stages in the fabrication thereof.
Figure 3:
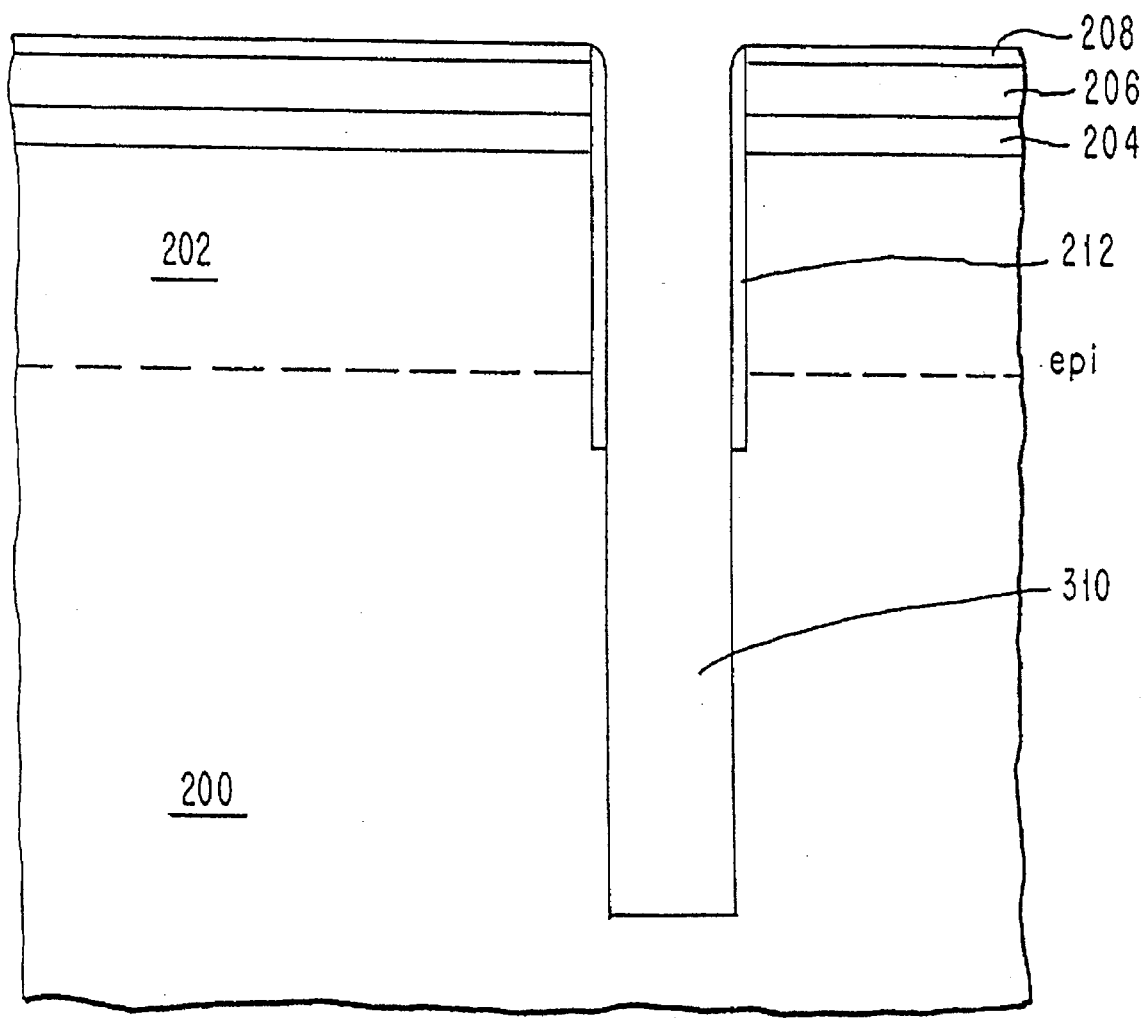

Referring to FIG. 2, a doped silicon substrate 200 with a lightly doped epitaxial layer 202 of silicon is provided. Next, thin layers of nitride 204, oxide 206 and nitride 208, respectively, are blanketly deposited on the epitaxial layer 202 of the substrate to form a protective layer for subsequent etching steps. Next, a trench 210 is etched to about 0.5 µm to 0.6 µm into the substrate as follows. First, a patterned portion of layers 204, 206 and 208 are etched using photoresist and reactive ion etching (RIE). Then, using the remaining portions of layers 204, 206 and 208 as a mask, trench 210 is etched using RIE to a depth below that of the n-well (or p-well) depth of the memory array (not shown). The well depth typically is about 0.5 µm. Nitride collar 212 is now formed around the neck of the trench in the position shown in FIG. 2 by blanketly depositing a layer of nitride on the structure, and then anisotropically etching by RIE to remove this nitride layer from horizontal surfaces. If desired, as discussed previously, a sub-minimum lithographic trench may be initially etched by applying spacers to the oxide mask. The trench is then further etched to its full depth, as shown in FIG. 3. In FIG. 3, the deepened trench is labelled 310.

Figure 4:
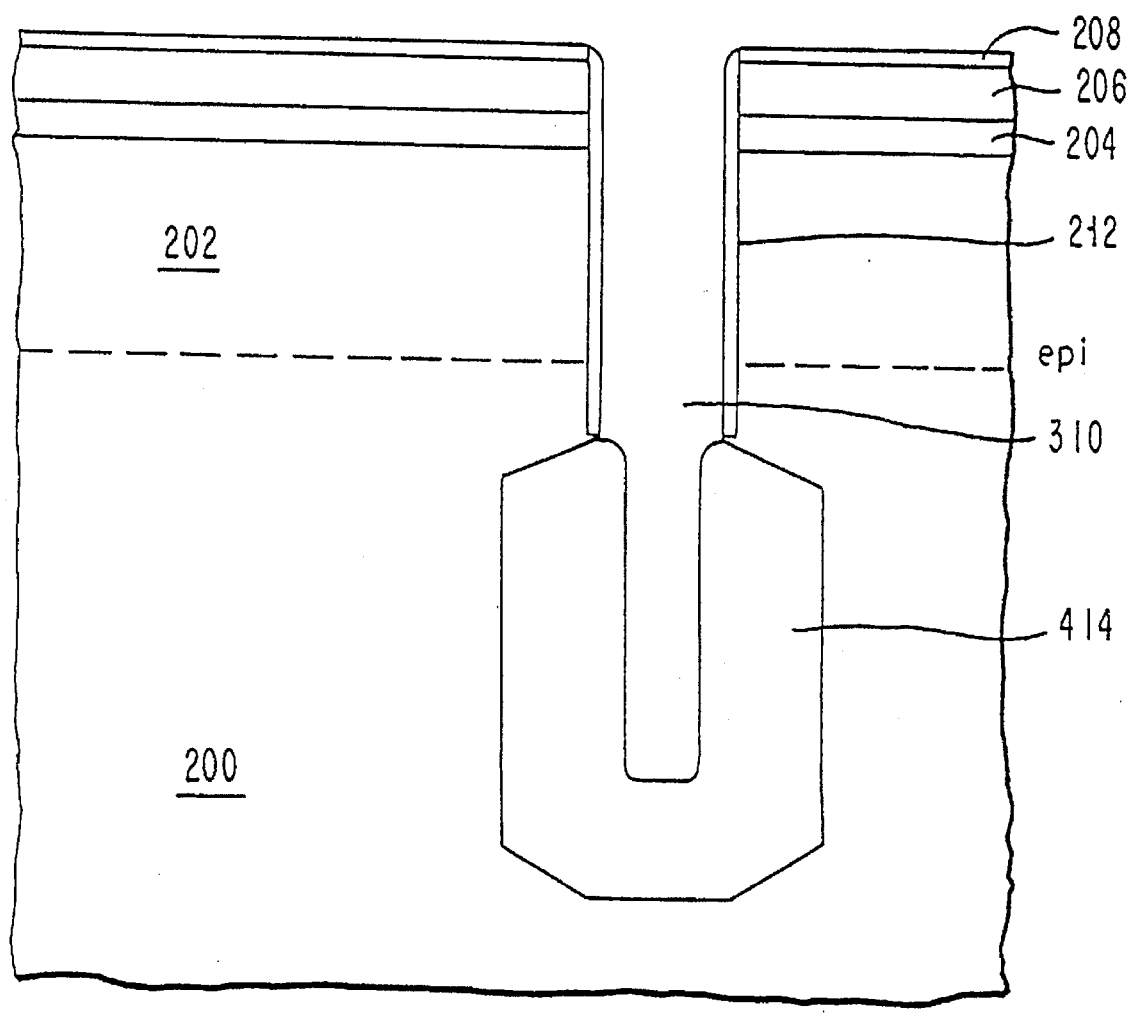

The trench 310 is now oxidized by thermal oxidation, resulting in the oxide layer 414 on the walls of trench 310, as shown in FIG. 4. The trench within the epi region 202 is protected from oxidation by the nitride collar 212. The distance of the lateral extension of the oxide layer 414 is proportional to the oxidation time. The lateral extension of the oxide layer, in turn, determines the lateral expansion of the trench under the access device.

Figure 5:
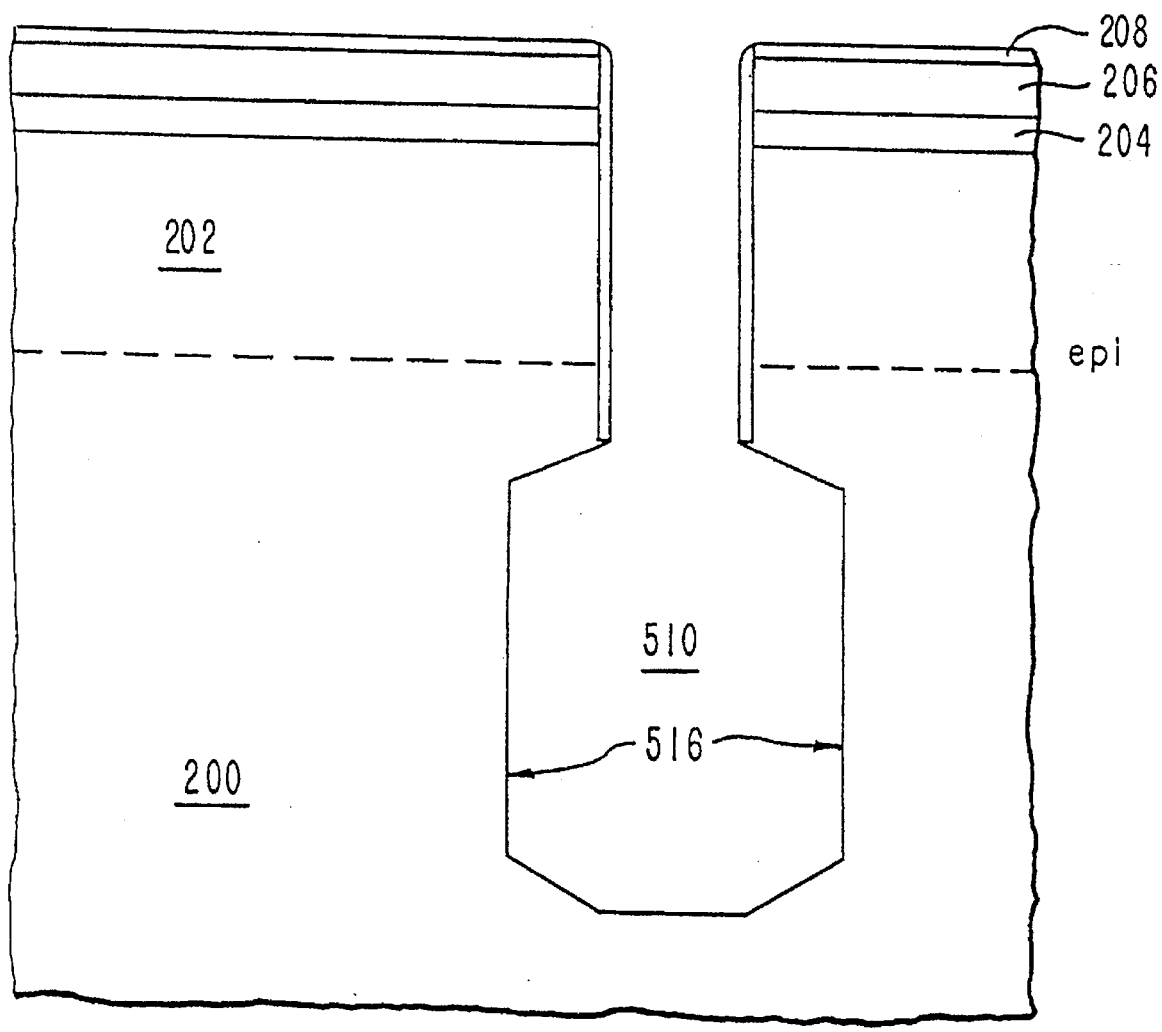
Figure 6:
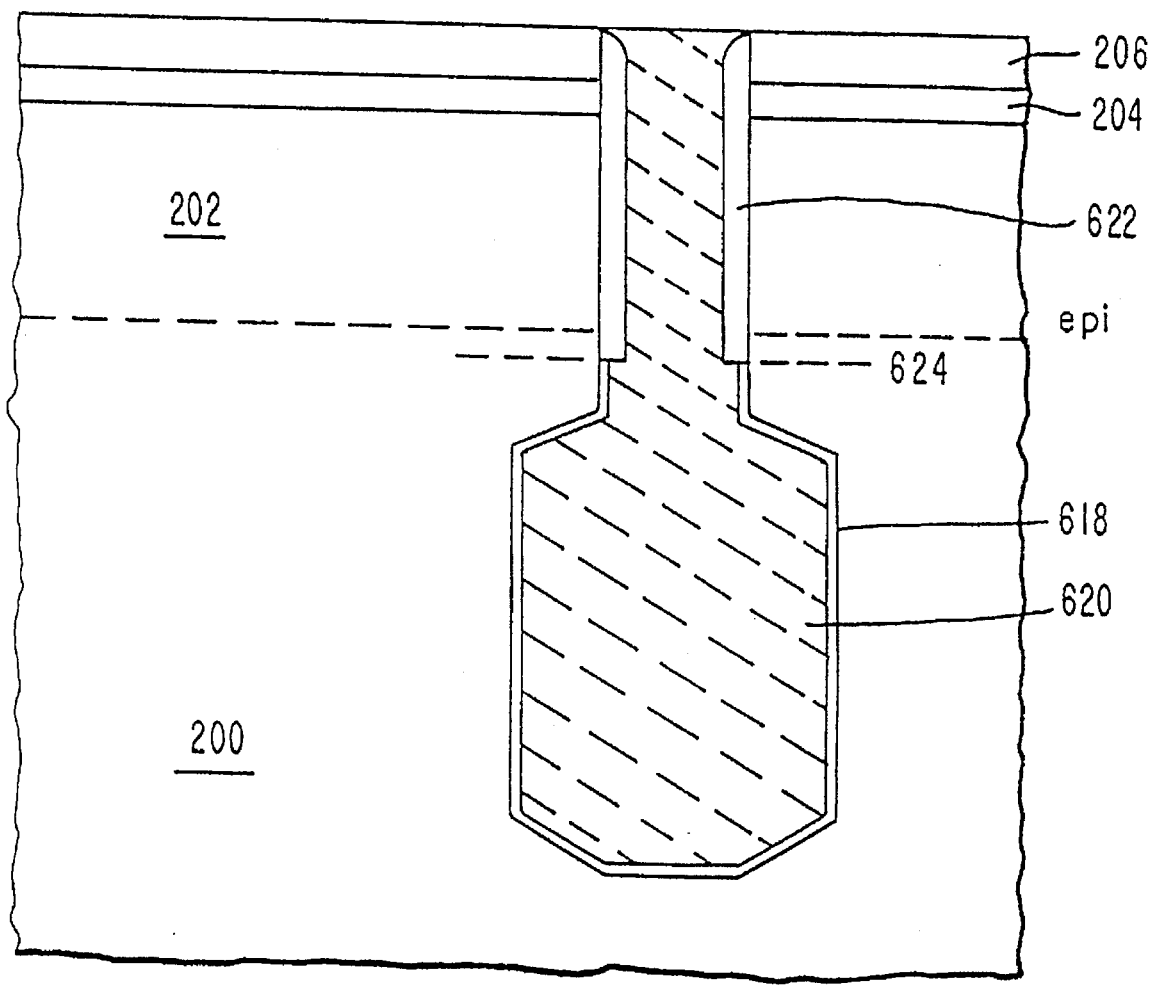

The oxide layer 414 is now isotropically etched using a buffered HF etch to obtain the bottle-shaped trench. This process of oxidation of the trench followed by etching may require more than one iteration to achieve the desired final trench size. The resulting structure, with the expanded trench now labelled 510, is shown in FIG. 5. Note also that the nitride collar may be substantially or even completely etched away during this process, so the actual structure may or may not have the nitride collar shown in FIG. 5.

Capacitor dielectric 618 is now formed on the walls 516 of the trench. The dielectric preferably is a thin oxide-nitride-oxide composite, formed by performing a thin oxidation of the trench surface 516, followed by low pressure, isotropic deposition of a thin layer of nitride on the oxide layer, followed by thermal oxidation of the nitride layer.

Next, the trench is filled with polysilicon fill 620. This is achieved by insitu doped polysilicon deposition. To prevent closure of the neck of the trench prior to filling the trench, a deposition and anisotropic etch back process may be used to fill the bottle shaped trench without voids. The polysilicon formed on the surface of the structure is then planarized and recessed to a depth 624. Next, the entire structure is oxidized and anisotropically etched form insulating collar 622. Finally, polysilicon is again blanketly deposited on the structure to fill the remainder of the trench (the void in the collar), and planarized to yield the structure shown in FIG. 6.

Conventional steps, for instance as described in Nesbit, are used to continue the processing to fabricate the remaining portions of the structure shown in FIG. 1.

In summary, a high density trench DRAM cell where the trench capacitor is disposed at least partially under the cell has been described. Unlike previously known buried trench cells, the proposed structure does not require use of expensive selective epi growth techniques. By allowing the trench to be conveniently expanded, the method of the present invention allows trench capacitance to be increased without etching deeper trenches, and without using a thinner capacitor dielectric.

While the invention has been described in particular with respect to preferred embodiments thereof, it will be understood by those skilled in the art that modifications to the disclosed embodiments can be effected without departing from the spirit and scope of the invention.

What is claimed is:

1. A method for forming a trench capacitor, comprising:

providing a substrate;

forming a trench of a first depth in the substrate, the trench having an opening of a first cross sectional area at the surface of the substrate;

forming a collar on the wall of the trench of said first depth;

increasing the depth of the trench below the collar to a second depth in the substrate;

expanding that portion of the trench of said second depth below the collar using an oxidation process to a cross-sectional area larger than the first cross-sectional area;

forming a dielectric layer on the wall of the trench in the expanded portion of the trench; and then filling the trench with a polysilicon material.

2. The method of claim 1, wherein the step of forming a trench in the substrate comprises:

forming a layer of protective material on the surface of the substrate;

patterning an area on the surface of the protective layer corresponding to a location of the opening of the trench, the area having a cross-sectional area approximately equal to the first cross-sectional area;

removing the patterned area of the protective layer;

etching the substrate through the removed patterned area to form the trench.

3. The method of claim 2, wherein the step of filling the trench comprises repeatedly depositing polysilicon in the trench and etching it back, whereby the trench becomes filled with polysilicon free of voids.

4. The method of claim 2, wherein the protective layer comprises a first nitride layer on the surface of the substrate, an oxide layer on the first nitride layer and a second nitride layer on the oxide layer.

5. The method of claim 1, wherein the collar is formed of nitride.

6. The method of claim 5, wherein the step of expanding the trench comprises:

oxidizing the wall of the trench below the collar;

isotropically etching the oxidized portion of the wall.

7. The method of claim 1, wherein the dielectric material is an oxide-nitride-oxide composite.

* * * * *